United States Patent [19]
Ker et al.

[11] Patent Number: 5,631,793
[45] Date of Patent: May 20, 1997

[54] CAPACITOR-COUPLE ELECTROSTATIC DISCHARGE PROTECTION CIRCUIT

[75] Inventors: Ming-Dou Ker; Chung-Yu Wu, both of Hsin-Chu; Tao Cheng; Chau-Neng Wu, both of Kaohsiung Hsien; Ta-Lee Yu, Hsin-Chu Hsien, all of Taiwan

[73] Assignee: Winbond Electronics Corporation, Taiwan

[21] Appl. No.: 523,653

[22] Filed: Sep. 5, 1995

[51] Int. Cl.⁶ .................................................. H02H 9/00
[52] U.S. Cl. .................................... 361/56; 361/111
[58] Field of Search ............................. 361/111, 54, 56, 361/91

[56] References Cited

U.S. PATENT DOCUMENTS

| | | | |
|---|---|---|---|
| 5,086,365 | 2/1992 | Lien | 361/58 |
| 5,173,755 | 12/1992 | Co et al. | 257/361 |
| 5,208,475 | 5/1993 | Mortensen | 257/360 |
| 5,208,719 | 5/1993 | Wei | 361/56 |
| 5,237,395 | 8/1993 | Lee | 257/358 |
| 5,287,241 | 2/1994 | Puar | 361/56 |
| 5,528,188 | 6/1996 | Au et al. | 361/56 |
| 5,530,612 | 6/1996 | Maloney | 361/56 |

OTHER PUBLICATIONS

"Improving the ESD Failure Thresold of Silicided-MOS Output Transistor by Ensuring Uniform Current FLow", IEEE Transactions on Electron Devices, vol. 39, No. 2, Feb. 1992, authored by Thomas L. Polgreen et al.

"Dynamic Gate Coupling of NMOS for Efficient Output ESD Protection", IEEE, 1992, authored by Charvaka Duvvury et al.

"Achieving Uniform NMOS Device Power Distribution for Sub-micron ESD Reliability", IEEE, 1992, authored by Charvaka Duvvury et al.

*Primary Examiner*—Jeffrey A. Gaffin
*Assistant Examiner*—Sally C. Modley
*Attorney, Agent, or Firm*—Laff, Whitesel, Conte & Saret, Ltd.

[57] ABSTRACT

The present invention is related to a capacitor-couple electrostatic discharge (ESD) protection circuit for protecting an internal circuit and/or an output buffer of an IC from being damaged by an ESD current. The capacitor-couple ESD protection circuit according to the present invention includes an ESD bypass device for bypassing the ESD current, a capacitor-couple circuit for coupling a portion of voltage to the ESD bypass device, and a potential leveling device for keeping an ESD voltage transmitted for the internal circuit at a low potential level. By using the present ESD protection circuit, the snapback breakdown voltage can be lowered to protect the very thin gate oxide of the internal circuit especially in the submicron CMOS technologies.

11 Claims, 11 Drawing Sheets

CAPACITOR-COUPLE ELECTROSTATIC DISCHARGE PROTECTION CIRCUIT

FIELD OF THE INVENTION

The present invention is related to an electrostatic discharge (ESD) protection circuit, and more particularly to a capacitor-couple protection circuit.

BACKGROUND OF THE INVENTION

As CMOS technology is scaled down into deep submicron regime, the advanced processes, such as thinner gate oxide, shorter channel length, shallower source/drain junction, lightly doped drain CLDD) structure and silicided diffusion, ESD robustness of the deep submicron CMOS IC is degraded to a great extent. The descriptions of the related techniques are disclosed in T. L. Polgreen and A. Chatterjee, "Improving the ESD failure threshold of silicided n-MOS output transistors by ensuring uniform current flow", IEEE Trans. on Electron Devices, vol. 39, no. 2, pp. 379–388, Feb. 1992; C. D. Lien, "Electrostatic Discharge protection circuit", U.S. Pat. No. 5,086,365, Feb. 1992; C. Duvvury and C. Diaz, "Dynamic gate coupling of NMOS for efficient output ESD protection", Proc. of IRPS, pp. 141–150, 1992; and C. Duvvury, C. Diaz and T. Haddock, "Achieving uniform nMOS device power distribution for submicron ESD reliability", in Tech. Dig. of IEDM, pp. 131–134, 1992. To achieve the desired ESD robustness, an ESD protection circuit in submicron CMOS technologies having dimensions much larger than the dimensions of the protection circuit in conventional submicron CMOS technologies is generally necessary for each input or output pad. Such a necessity, however, is impractical for the high-pin-count submicron CMOS IC which is more and more popular nowadays. As known to those skilled in the art, the total layout area of a chip (die size) increases with the increase of the pad pitch. If the dimensions of the ESD protection circuit are too large, the pad pitch will have to be enlarged and the total layout area will accordingly be increased. It is difficult for the submicron CMOS IC to perform ESD robustness within small layout area.

In addition, several ESD protection circuits are provided for improving ESD reliability of CMOS IC, such as those disclosed in R. Co, K. F. Lee and K. W. Ouyang, "Capacitively induced electrostatic discharge protection circuit", U.S. Pat. No. 5,173,755, Dec. 1992; Y. H. Wei, "Output pad electrostatic discharge protection circuit for MOS device", U.S. Pat. No. 5,208,719, May 1993; G. L. Mortensen, "Electrostatic discharge protection device and a method for simultaneously forming MOS devices with both lightly doped and non lightly doped source and drain regions", U.S. Pat. No. 5,208,475, May 1993; K. F. Lee, "Power rail ESD protection circuit", U.S. Pat. No. 5,237,395, Aug. 1993; and D. S. Puar, "Shunt circuit for electrostatic discharge protection", U.S. Pat. No. 5,287,241, Feb. 1994. However, the above protection devices need other auxiliary devices (such as the field-oxide device, thin-oxide NMOS and PMOS, or zener diode) which generally occupy more extra layout area to perform ESD protection. Moreover, the gate oxide is scaled down to only 90±10 Å in a 0.5-µm 3-V CMOS technology, and the gate-oxide breakdown voltage is around 9~12V in such submicron CMOS technology. The initial ram-on voltage of NMOS/PMOS device with its gate shorted to its source depends on the snapback voltage generated in accordance with the punchthrough or the avalanche breakdown at the drain. The snapback voltage of short-channel NMOS/PMOS device conventionally used for protecting the input gate, however, typically has a value of about 10~11V in such a 0.5-µm 3-V CMOS technology. It possibly leads to the rupture of the gate oxide and accordingly causes damage on the input gate because the snapback voltage of short-channel NMOS/PMOS devices is near or even higher than the gate-oxide breakdown voltage. Thus, the reduction of the snapback voltage is also an important factor for the design of the ESD protection circuit. A conventional process for reducing the snapback voltage is performed by using an additional ESD-implantation step. Unfortunately, the addition of the implantation step increases the complexity of submicron CMOS technology as well as the fabrication cost.

SUMMARY OF THE INVENTION

An object of the present invention is to provide a capacitor-couple ESD protection circuit adapted to be used in an IC and having a reduced size so that a purpose for the fabrication of a high-pin-count IC can be achieved.

Another object of the present invention is to provide a capacitor-couple ESD protection circuit which can be used both in the input region and the output region.

Also an object of the present invention is to provide a capacitor-couple ESD protection circuit which causes a lower snapback voltage so that the thinner gate oxide of an CMOS IC, especially a submicron CMOS IC, can be prevented from rupture.

A further object of the present invention is to provide a capacitor-couple ESD protection circuit which reduces the snapback voltage according to a polarity state of an ESD current.

A still further object of the present invention is to provide a capacitor-couple ESD protection circuit which lowers the snapback voltage by coupling suitable voltage to an ESD bypass device thereof.

In accordance with the present invention, an electrostatic discharge (ESD) protection circuit is adapted to be used in an integrated circuit (IC) and is connected between an input pad and an internal circuit of the IC for protecting the internal circuit from being damaged by an ESD current, wherein the capacitor-couple ESD protection circuit includes an ESD bypass device electrically connected to the internal circuit for protecting the internal circuit by bypassing the ESD current, a capacitor-couple circuit electrically connected to the ESD bypass device and coupling a little portion of ESD voltage to the ESD bypass device when the ESD voltage occurring at the input pad is in a first polarity state, and a potential leveling device parasitizing to the ESD bypass device and keeping an ESD voltage transmitted for the internal circuit at a low potential level when the ESD voltage occurring at the input pad is in a second polarity state different from the first polarity state.

In this case, for example, the first polarity state is a state that the ESD voltage has a positive polarity to VSS but a floating VDD or a state that the ESD voltage has a negative polarity to VDD but a floating VSS. On the other hand, the second polarity state is a state that the ESD voltage has a negative polarity to VSS but a floating VDD or a state that the ESD voltage has a positive polarity to VDD but a floating VSS.

In accordance with another aspect of the present invention, an electrostatic discharge (ESD) protection circuit is adapted to be used in an integrated circuit (IC) and is connected between an internal circuit and an output pad of the IC for protecting an output buffer, wherein the capacitor-couple ESD protection circuit includes an ESD bypass device electrically connected to the output pad for bypassing the ESD current inputted from the output pad, a capacitor-couple circuit electrically connected to the ESD bypass device and coupling a portion of voltage to the ESD bypass device when the ESD voltage occurring at the output pad is in a first polarity state, and a potential leveling device parasitizing to the ESD bypass device and keeping an ESD voltage transmitted for the internal circuit at a low potential level when the ESD voltage occurring at the output pad is in a second polarity state different from the first polarity state.

In this case, the output buffer preferably serves as the ESD bypass device. On the other hand, for example, the first polarity state is a state that the ESD voltage has a positive polarity to VSS but a floating VDD or a state that the ESD voltage has a negative polarity to VDD but a floating VSS, while the second polarity state is a state that the ESD voltage has a negative polarity to VSS but a floating VDD or a state that the ESD voltage has a positive polarity to VDD but a floating VSS.

According to another aspect of the present invention, the capacitor-couple circuit includes a capacitor.

According to another aspect of the present invention, the ESD bypass device includes a MOS transistor, which may be a PMOS or an NMOS. The gate, source and drain electrodes of the MOS transistor are electrically connected to the capacitor-couple circuit, the input pad, and a power source terminal, respectively.

According to another aspect of the present invention, the potential leveling device includes a diode.

According to another aspect of the present invention, the ESD protection circuit preferably further includes a delay circuit electrically connected to the input pad and the ESD bypass device for delaying the conductive time of the ESD bypass device when an ESD current occurs at the input pad in order to substantially completely bypassing the ESD current, and mining the ESD bypass device off when the IC is in normal operating conditions. The delay circuit can include a resistor.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
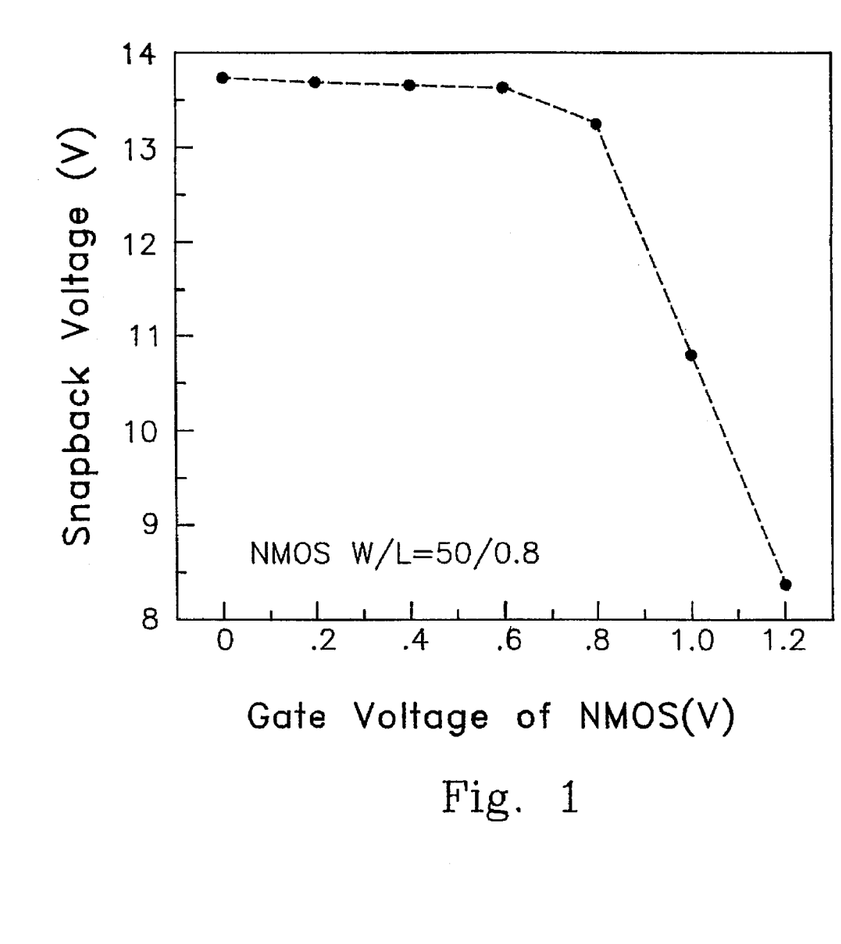
FIG. 1 is a snapback voltage vs. gate voltage plot showing the effect of a gate voltage of a short-channel NMOS (W/L=50/0.8 μm) on a snapback voltage thereof.

FIG. 1 shows a snapback voltage vs. gate voltage plot showing the effect of a gate voltage of a typical short-channel NMOS (W/L=50/0.8 μm) on a snapback breakdown voltage (hereinafter, snapback voltage) thereof. From FIG. 1, it is obvious that the snapback voltage decreases as the gate voltage increases. The effect of the gate voltage on the snapback voltage is also shown in a typical short-channel PMOS. In other words, if the gate voltage of a MOS can be appropriately raised, the snapback voltage thereof will accordingly be cut down. Therefore, a preferred embodiment according to the present invention uses a capacitor-couple circuit to couple a portion of voltage to the gate of a MOS device which serves as a main structure of an ESD bypass device, thereby raising the gate voltage thereof so as to lower the snapback voltage. Thus, the internal circuit of an IC can be protected from the damage caused by ESD current.

Figure 2:
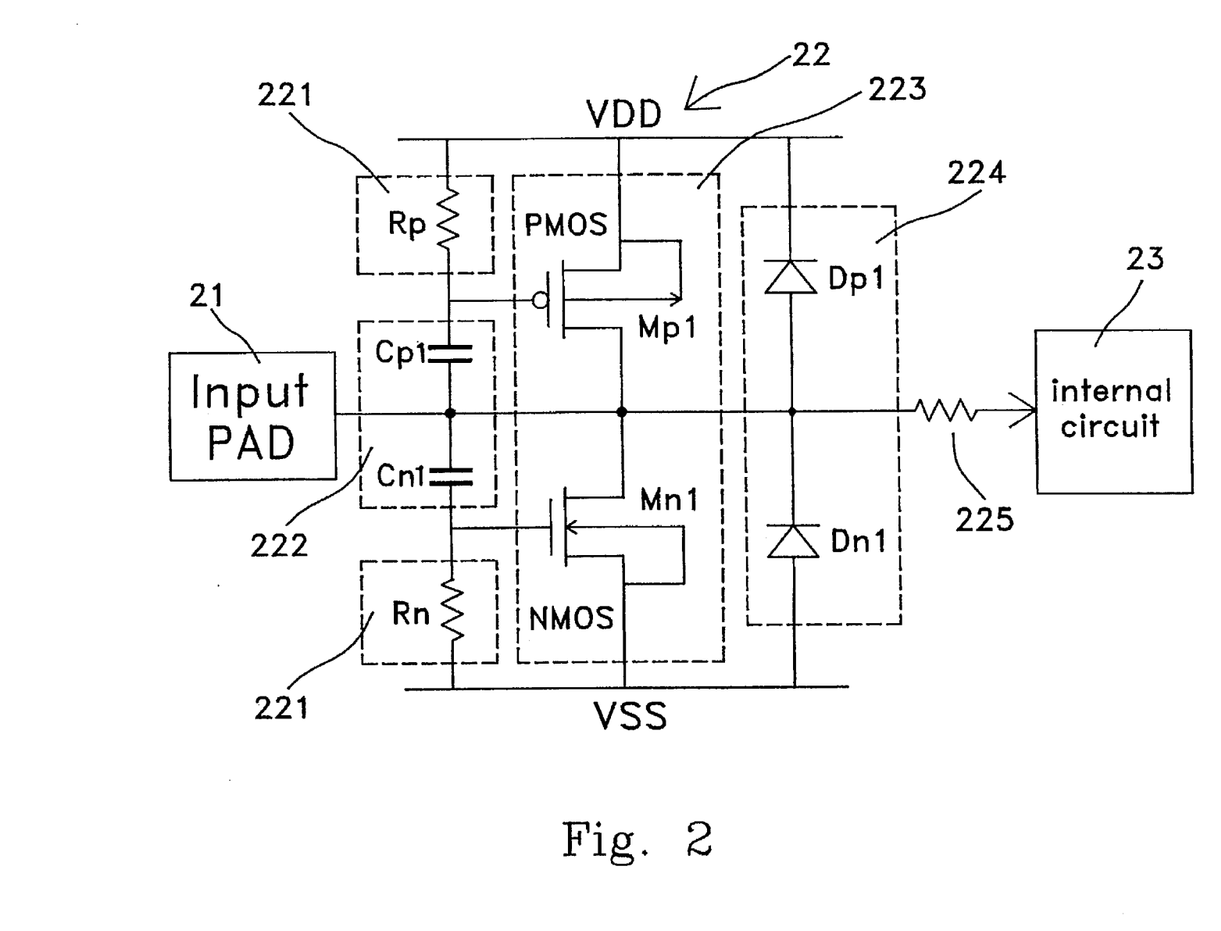
FIG. 2 is a schematic circuit block diagram showing a preferred embodiment of a capacitor-couple ESD protection circuit used in an input region of an IC according to the present invention.

Please refer to FIG. 2 which schematically shows a preferred embodiment of a capacitor-couple ESD protection circuit used in an input region of an IC according to the present invention. In FIG. 2, the ESD protection circuit 22 is installed between an input pad 21 and an internal circuit 23 of the IC, and includes a delay circuit 221, a capacitor-couple circuit 222, an ESD bypass device 223, a potential leveling device 224 and a time-delay resistor 225. The ESD bypass device 223 includes a PMOS Mp1 arranged between the input pad 21 and VDD, and an NMOS Mn1 arranged between the input pad 21 and the VSS; the delay circuit 221 includes a resistor Rp electrically connected between the gate of the PMOS Mp1 and VDD node, and a resistor Rn electrically connected between the gate of the NMOS Mn1 and VSS node; the capacitor-couple circuit 222 includes a capacitor Cp1 electrically connected between the gate of the PMOS Mp1 and the input pad 21, and a capacitor Cn1 electrically connected between the gate of the NMOS Mn1 and the input pad 21; and the potential leveling device 224 includes a junction diode Dp1 having the anode thereof electrically connected to the input pad 21 and the cathode thereof electrically connected to VDD, and a junction diode Dn1 having the anode thereof electrically connected to VSS and the cathode thereof electrically connected to the input pad 21. In addition, as shown in FIG. 2, both of the drain of the PMOS Mp1 and that of the NMOS Mn1 are electrically connected to the input pad 21, and the source of the PMOS Mp1 and that of the NMOS Mn1 are electrically connected to VDD and VSS, respectively. Moreover, the diodes Dp1 and Dn1 are inherently formed by the parasitic p-n junction between the drain and the bulk of the MOS Mp1 and Mn1, respectively. The capacitors Cp1 and Cn1 are designed for coupling suitable voltage to the gates of the MOS Mp1 and Mn1 to lower the snapback voltages of the MOS Mp1 and Mn1, respectively, during the ESD transition. The resistors Rp and Rn are used for holding the coupled voltages longer in time on the gates of the MOS Mp1 and Mn1, respectively, to sustain the breakdown of the MOS Mp1 and Mn1 with lower snapback voltage to bypass ESD current. The operation principles of the preferred embodiment shown in FIG. 2 will be described as follows with reference to FIGS. 2–5.

In normal CMOS operating conditions with VDD and VSS power supplies, a high voltage-level input signal is clamped by the diode Dp1 to about VDD+0.6V, and a low voltage-level input signal is clamped by the diode Dn1 to about VSS–0.6V. Due to the gates of the MOS Mp1 and Mn1 are connected to VDD and VSS through resistors Rp and Rn, respectively, the MOS Mp1 and Mn1 are always kept off during the normal operations of the CMOS IC's. Thus, the present ESD protection circuit 22 is inactive as the CMOS IC is in its normal operations, and the voltage level of input signals can be clamped between VDD+0.6V and VSS–0.6V.

In ESD-stress conditions, the ESD voltage occurring at the input pad 21 may have positive or negative polarities to VDD or VSS nodes. Thus, there are four kinds of ESD polarity states on a pad, as shown in Table 1.

TABLE 1

Figure 3A:
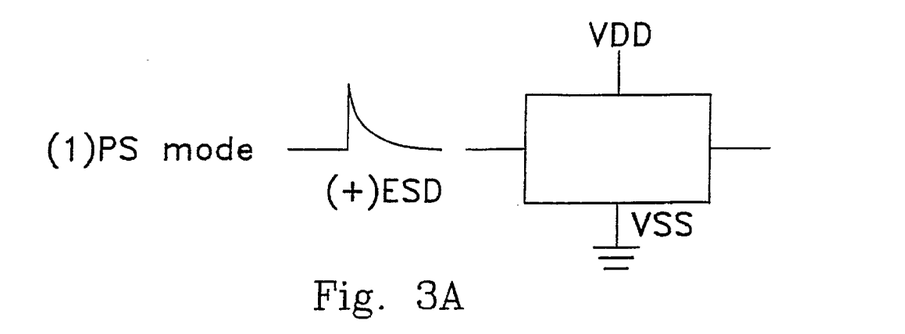
FIGS. 3A~3D are schematic diagrams showing four kinds of polarity states of an ESD voltage, respectively.
Figure 3B:
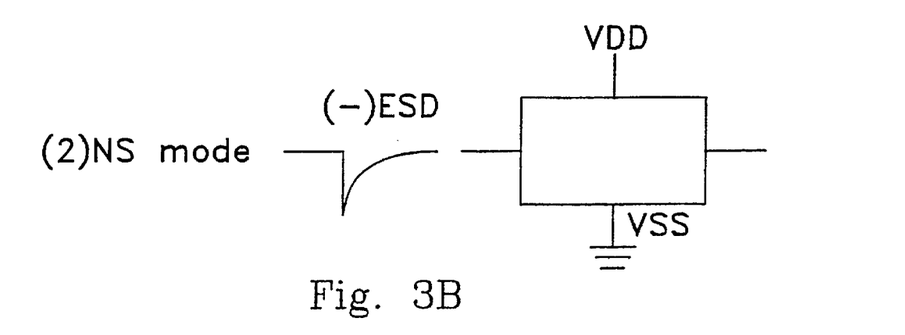
Figure 3C:
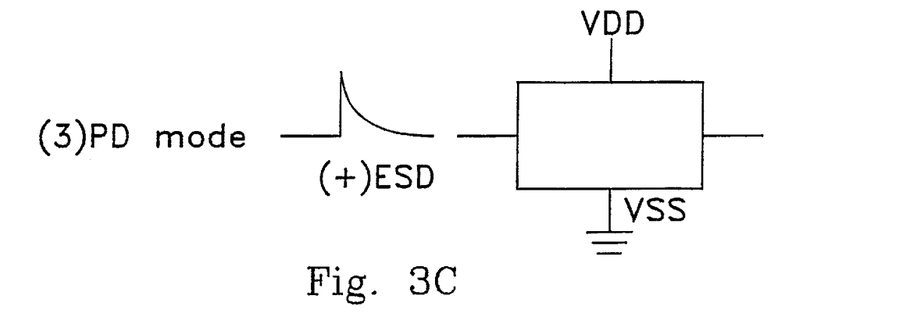
Figure 3D:
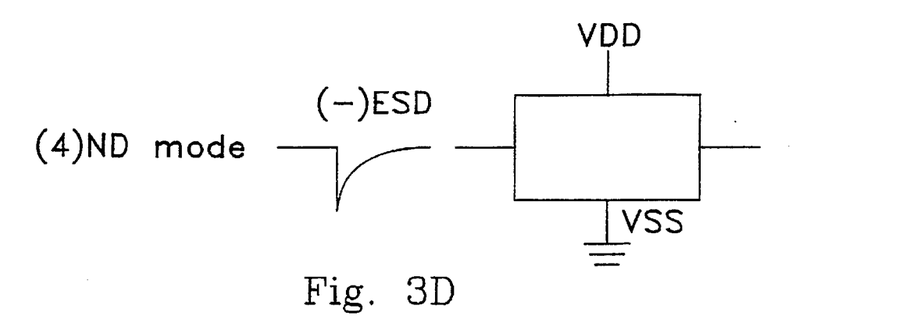

| mode | VSS state | VDD state | reference drawing |
| --- | --- | --- | --- |
| PS | positive polarity | floating | FIG. 3A |
| NS | negative polarity | floating | FIG. 3B |
| PD | floating | positive polarity | FIG. 3C |
| ND | floating | negative polarity | FIG. 3D |

The internal circuit of the IC could be subject to damage caused by these four modes of ESD stresses if there is no effective ESD protection circuit provided. Therefore, four kinds of resolutions responding to the four modes of ESD stresses are provided here for purpose of protection.

Figure 4A:
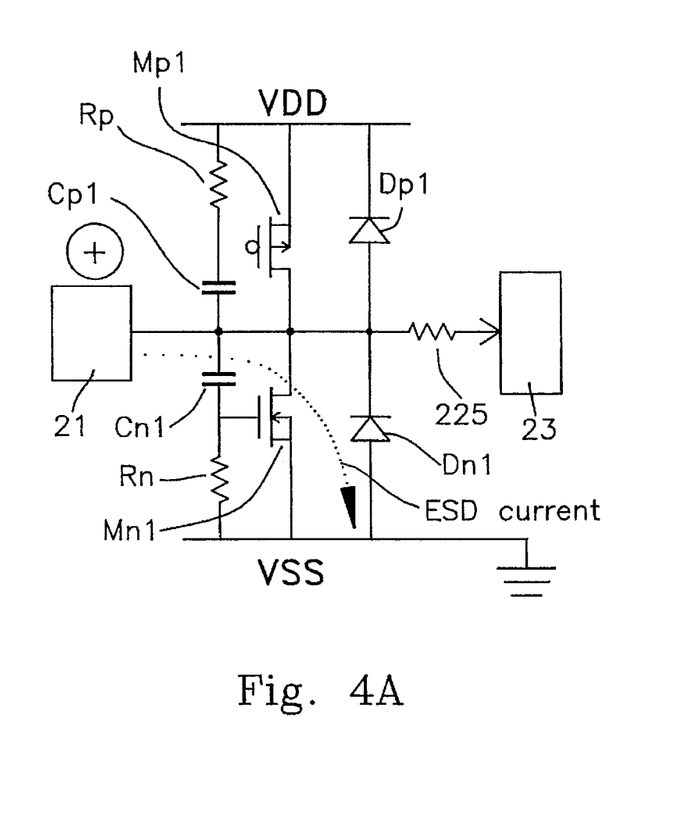
FIGS. 4A~4D are schematic circuit diagrams showing four kinds of operation states of the preferred embodiment of FIG. 2 in responsive to the four kinds of polarity states of the ESD voltage, respectively.

(1) PS mode:

As a PS-mode ESD stress occurs at the input pad 21, the positive ESD voltage rises very quickly. The quick rising ESD voltage is coupled with a portion of positive voltage to the gate of the NMOS Mn1 by the capacitor Cn1 having appropriate capacitance. Meanwhile, as shown in FIG. 1, the increase of the gate voltage results in the decrease of the snapback voltage so that the drain of the NMOS Mn1 breaks down to bypass ESD current from the input pad 21 to VSS. The NMOS Mn1 in its breakdown condition clamps the ESD voltage on the input pad 21 to about its snapback voltage, so as to protect the internal circuit 23 of the IC from the damage caused by the ESD current. In this case, the ESD current flow is shown in FIG. 4A.

On the other hand, the resistor Rn is used for delaying the discharge of the gate voltage coupled thereto the portion of positive voltage to extend the conductive time so that the ESD current peak having most adverse effect on the NMOS Mn1 and the internal circuit 23 can be completely protected.

Figure 4B:
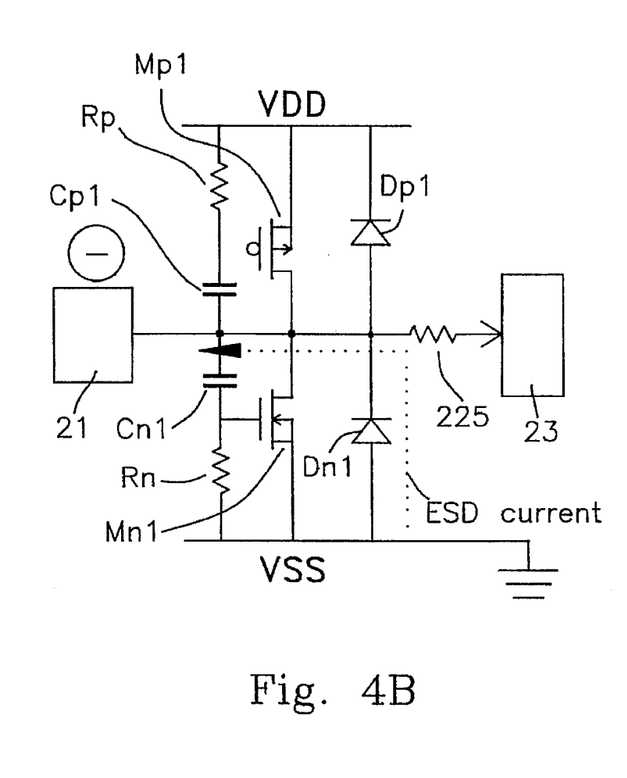

(2) NS mode:

As an NS-mode ESD stress occurs at the input pad 21, the diode Dn1 is forward biased to bypass the ESD current. The negative ESD voltage on the input pad 21 is clamped to about –0.6V which will not cause any damage to the internal circuit 23. In this case, the ESD current flow is shown in FIG. 4B.

Figure 4C:
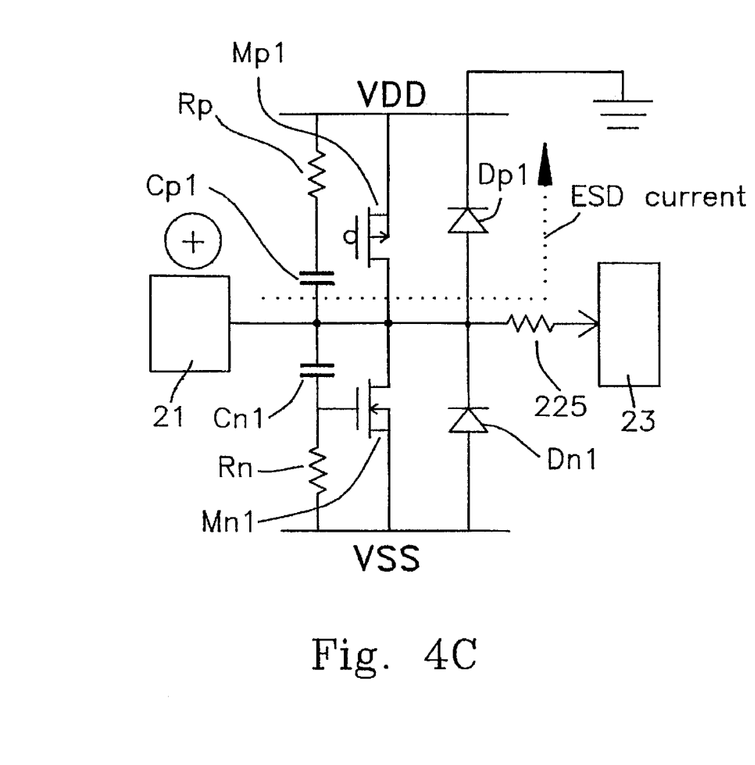

(3) PD mode:

As a PD-mode ESD stress occurs at the input pad 21, the diode Dp1 is forward biased to bypass the ESD current. The positive ESD voltage on the input pad 21 is clamped to about +0.6V which will not cause any damage to the internal circuit 23. In this case, the ESD current flow is shown in FIG. 4C.

Figure 4D:
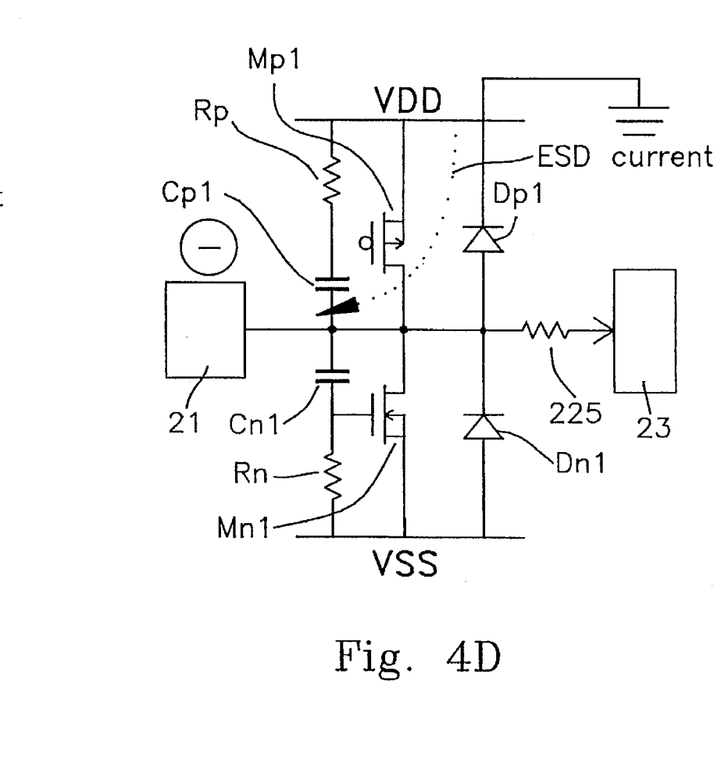

(4) ND mode:

As an ND-mode ESD stress occurs at the input pad 21, the negative ESD voltage rises very quickly. The quick rising ESD voltage is coupled with a portion of negative voltage to the gate of the PMOS Mp1 by the capacitor Cp1 having appropriate capacitance. Meanwhile, as shown in FIG. 1, the increase of the gate voltage results in the decrease of the snapback voltage so that the drain of the PMOS Mp1 breaks down to bypass ESD current from the input pad 21 to VDD. The PMOS Mp1 in its breakdown condition clamps the ESD voltage on the input pad 21 to about its snapback voltage, so as to protect the internal circuit 23 of the IC from the damage caused by the ESD current. In this case, the ESD current flow is shown in FIG. 4D.

On the other hand, the resistor Rp is used for delaying the discharge of the gate voltage coupled thereto the portion of positive voltage to extend the conductive time so that the ESD current peak having most adverse effect on the PMOS Mp1 and the internal circuit 23 can be completely protected.

Figure 5:
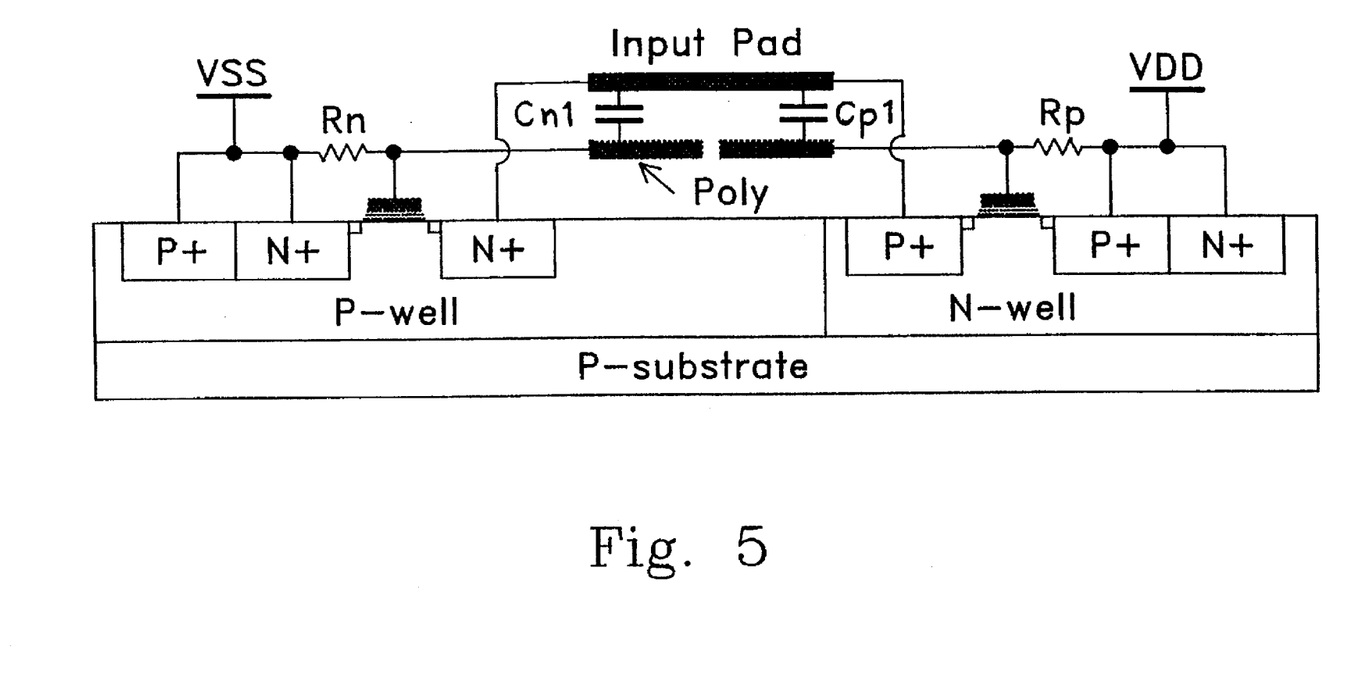
FIG. 5 is a cross-sectional view schematically showing the preferred embodiment of FIG. 2.

The corresponding schematic cross-sectional view of the preferred embodiment of FIG. 2 is shown in FIG. 5, where the p-substrate twin-well CMOS technology is used. Of course, the p-well, n-well or twin-well in n-type substrate can also be used. To achieve the capacitor-couple effect without increasing total layout area to the pad, the capacitors Cn1 and Cp1 are realized by inserting the poly layers tight under the metal pad. The resistors Rp and Rn are also realized by poly lines with their parasitic sheet resistances. The capacitances of the capacitors Cp1 and Cn1 can be adjusted by drawing different overlapped area of the poly layer right under the metal pad. The resistances of the resistors Rp and Rn can be adjusted by drawing different lengths of the poly lines.

Figure 9:
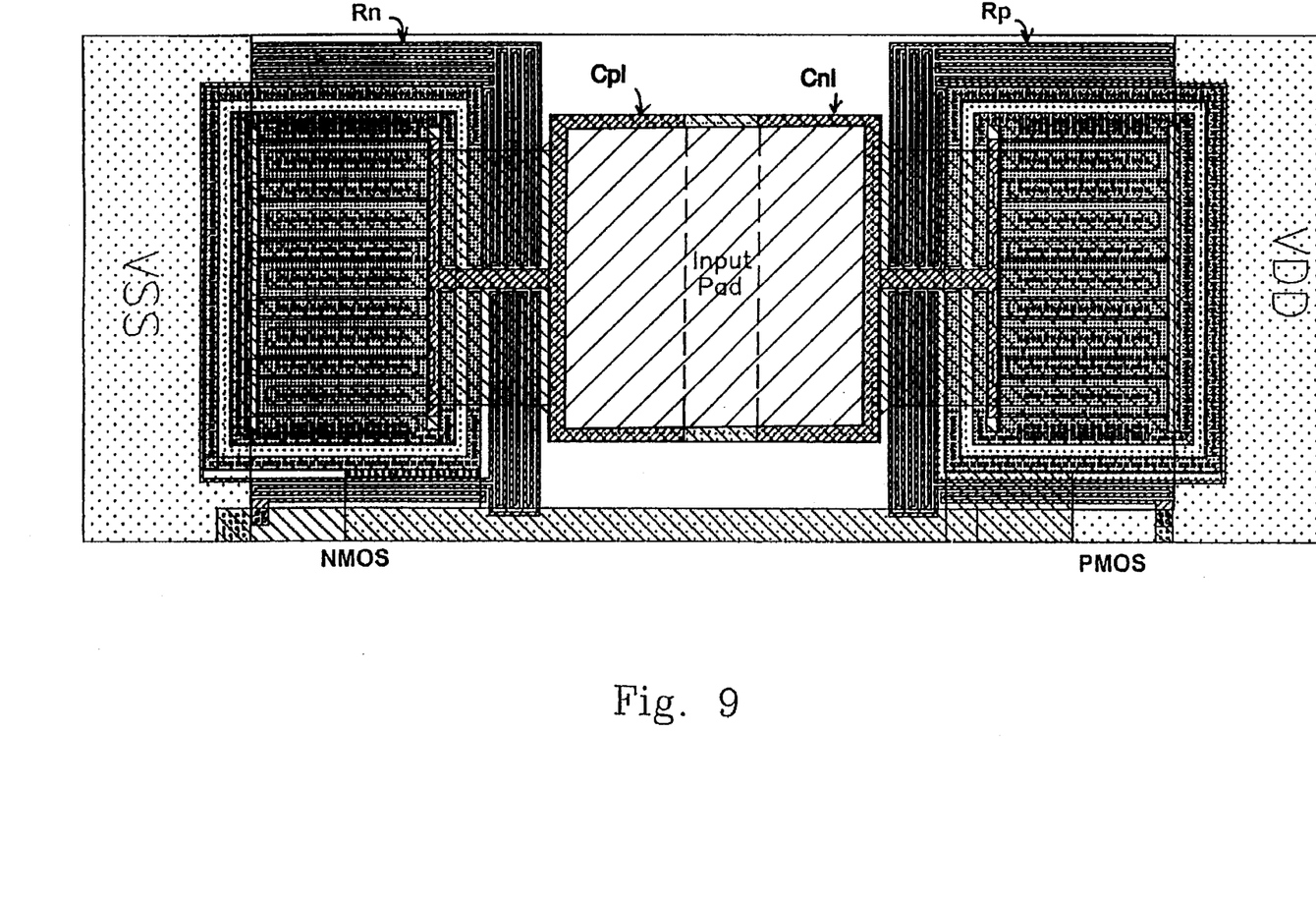
FIG. 9 is a schematic layout diagram showing an example of the capacitor-couple ESD protection circuit according to the present invention.

A layout example in which the ratio of W to L for both thin-oxide NMOS and PMOS is 500/1.0 (μm) as well as the poly layer to realize the capacitors Cn1 and Cp1 and the resistors Rn and Rp is shown in FIG. 9 and will be illustrated hereinafter. In this example, the capacitors Cn1 and Cp1 are both realized for a capacitance of 0.2pF, the resistors Rn and Rp are both realized for a resistance of 78.8 KΩ, and the NMOS Mn1 and PMOS Mp1 are surrounded by double guard rings ($N^+$ and $P^+$ diffusion) to prevent VDD-to-VSS latchup issue. With such capacitors Cn1 and Cp1, resistors Rn and Rp, latchup guard rings, NMOS, PMOS and a metal pad of 100×100 μm$^2$, the total layout shown in FIG. 5 only occupies an silicon area of 307×144.4 μm$^2$. Thus, the ESD robustness of the IC can be effectively improved according to the present invention without increasing the layout area to the chip. Therefore, the cost of the chip fabrication does not increase.

Figure 6:
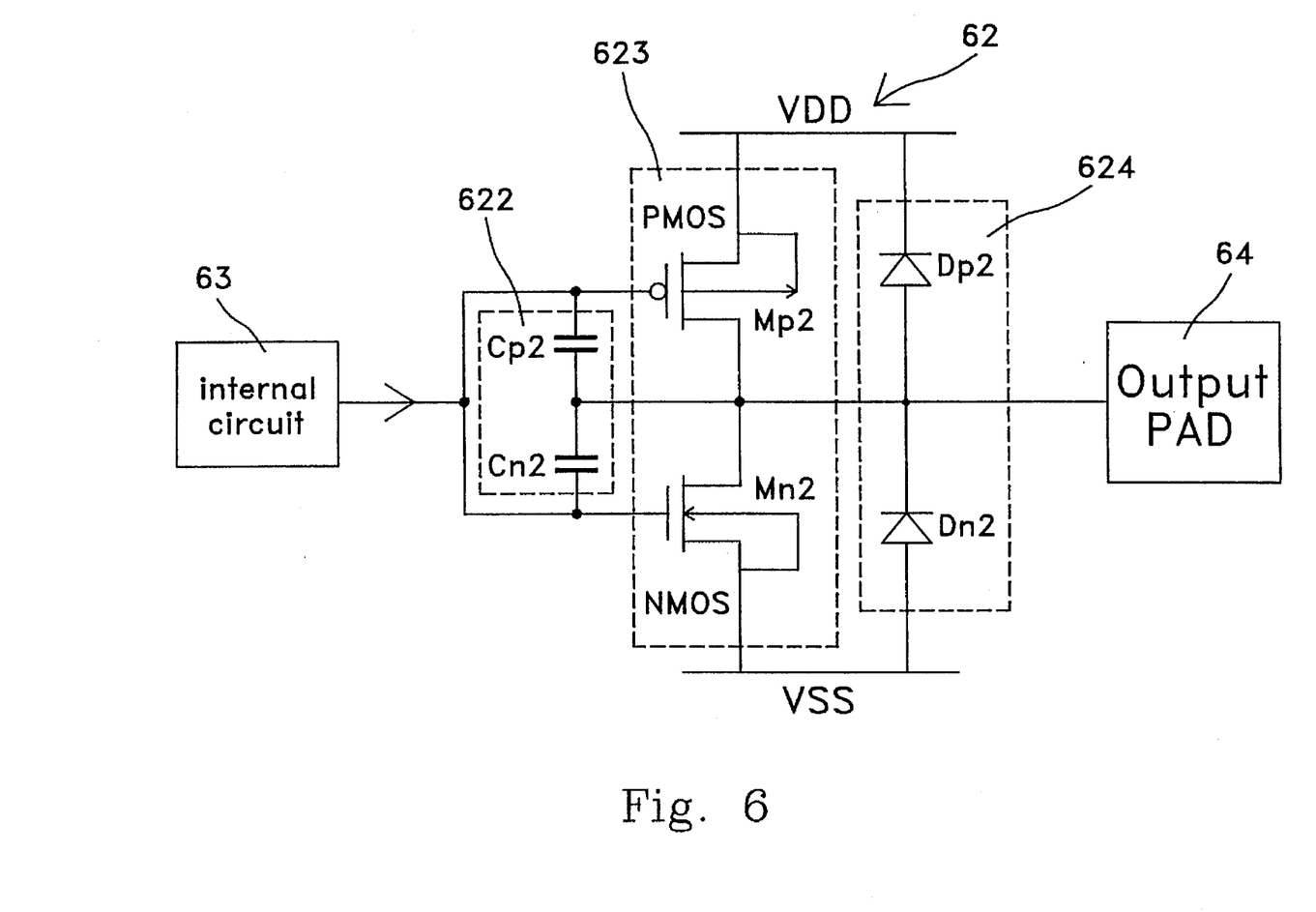
FIG. 6 is a schematic circuit block diagram showing a preferred embodiment of a capacitor-couple ESD protection circuit used in an output region of an IC according to the present invention.

Please refer to FIG. 6 which schematically shows a preferred embodiment of a capacitor-couple ESD protection circuit used in an output region of an IC according to the present invention. In FIG. 6, the ESD protection circuit 62 is installed between an output pad 64 and an internal circuit 63 of the IC, and includes a capacitor-couple circuit 622, an ESD bypass device 623 and a potential leveling device 624. In this preferred embodiment, a conventional output buffer existing between the internal circuit 63 and the output pad 64 for enabling a load connected thereto can serve as the ESD bypass device 623, and accordingly there is no additional bypass circuit required here. The ESD bypass device 623 includes a PMOS Mp2 arranged between the output pad 64 and VDD, and an NMOS Mn2 arranged between the output pad 64 and the VSS; the capacitor-couple circuit 622 includes a capacitor Cp2 electrically connected between the gate of the PMOS Mp2 and the output pad 64, and a capacitor Cn2 electrically connected between the gate of the NMOS Mn2 and the output pad 64; and the potential leveling device 624 includes a junction diode Dp2 having the anode thereof electrically connected to the output pad 64 and the cathode thereof electrically connected to VDD, and a junction diode Dn2 having the anode thereof electrically connected to VSS and the cathode thereof electrically connected to the output pad 64. In addition, as shown in FIG. 6, both of the drain of the PMOS Mp2 and that of the NMOS Mn2 are electrically connected to the output pad 64, and the source of the PMOS Mp2 and that of the NMOS Mn2 are electrically connected to VDD and VSS, respectively. Moreover, the diodes Dp2 and Dn2 are inherently formed by the parasitic p-n junction between the drain and the bulk of the MOS Mp2 and Mn2, respectively. The capacitors Cp2 and Cn2 are designed for coupling suitable voltage to the gates of the MOS Mp2 and Mn2 to lower the snapback voltages of the MOS Mp2 and Mn2, respectively, during the ESD transition. The operation principles of the preferred embodiment shown in FIG. 6 will be described as follows with reference to FIGS. 3 and 6–8.

In ESD-stress conditions, the ESD voltage occurring at the output pad 64 may have positive or negative polarities to VDD or VSS nodes. Thus, there are four kinds of ESD polarity states on a pad, as shown in Table 1.

The four kinds of resolutions responding to the four modes of ESD stresses are provided here for purpose of protection.

Figure 7A:
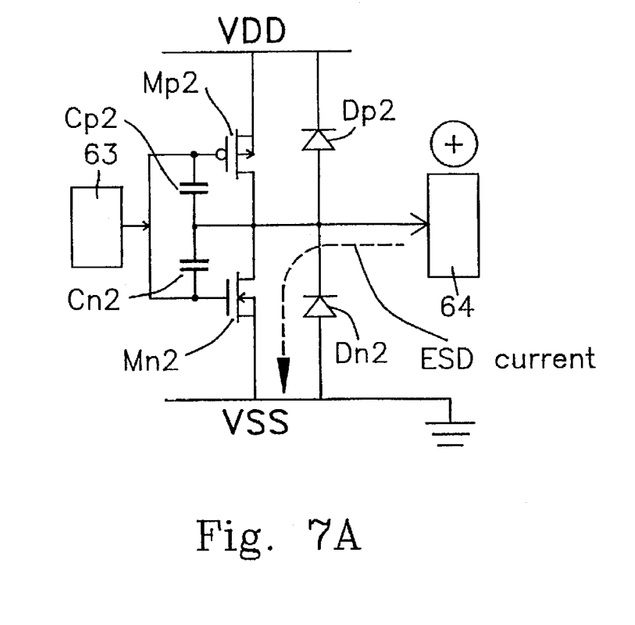
FIGS. 7A~7D are schematic circuit diagrams showing four kinds of operation states of the preferred embodiment of FIG. 6 in responsive to the four kinds of polarity states of the ESD voltage, respectively.

(1) PS mode:

As a PS-mode ESD stress occurs at the output pad 64, the positive ESD voltage will couple some positive voltage to the gate of the NMOS Mn2 through the capacitor Cn2. Thus, the NMOS Mn2 is turned on to bypass ESD current so as to protect itself. The coupled voltage to the gate of the NMOS Mn2 can be adjusted and designed by setting suitable capacitance of the capacitor Cn2. The NMOS Mn2 is often designed with larger W/L ratio and it is usually implemented in the multiple finger-type layout as that for the aforementioned layout example. The coupled gate voltage facilitates the multiple fingers of the large-dimension NMOS Mn2 to be turned on more uniformly in order to bypass ESD current, thereby significantly improving the ESD failure threshold of the NMOS Mn2. In this case, the ESD current flow is shown in FIG. 7A.

Figure 7B:
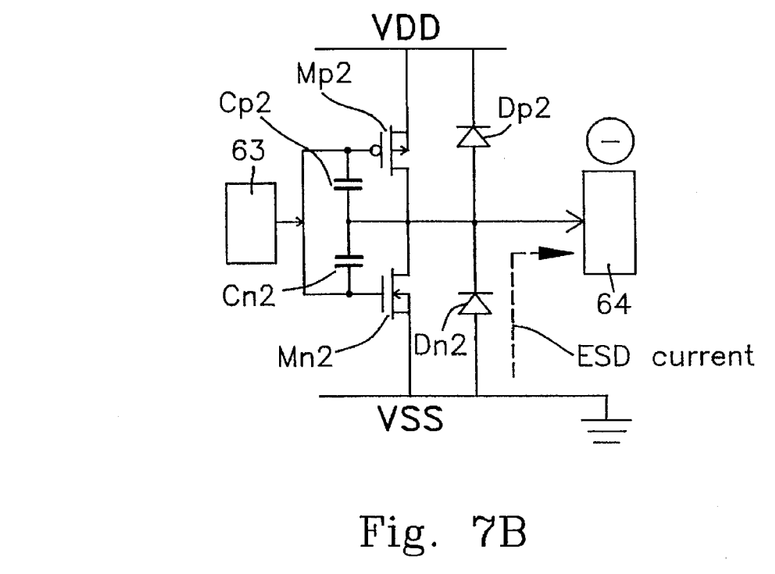

(2) NS mode:

As an NS-mode ESD stress occurs at the output pad 64, the diode Dn2 is forward biased to bypass the ESD current. The negative ESD voltage on the output pad 64 is clamped to about −0.6V which will not cause any damage to the output buffer 623. In this case, the ESD current flow is shown in FIG. 7B.

Figure 7C:
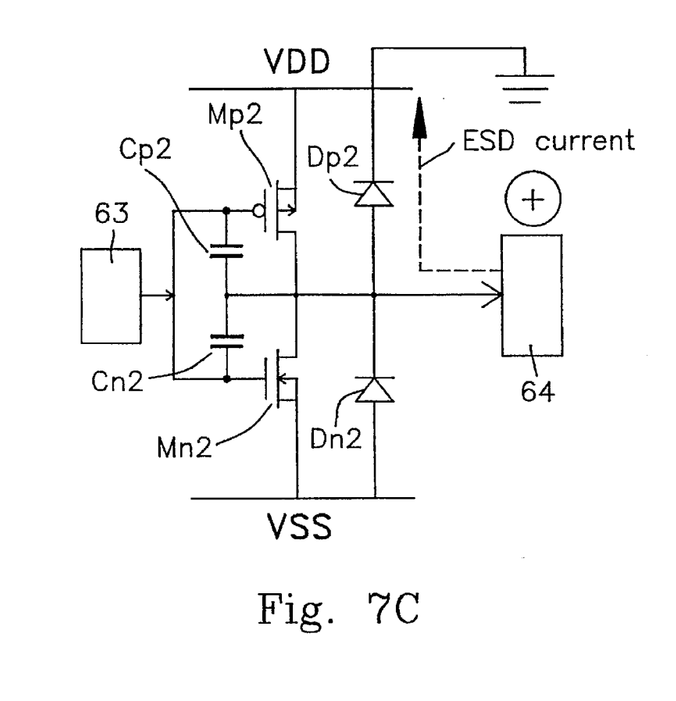

(3) PD mode:

As a PD-mode ESD stress occurs at the output pad 64, the diode Dp2 is forward biased to bypass the ESD current. The positive ESD voltage on the output pad 64 is clamped to about +0.6V which will not cause any damage to the output buffer 623. In this case, the ESD current flow is shown in FIG. 7C.

Figure 7D:
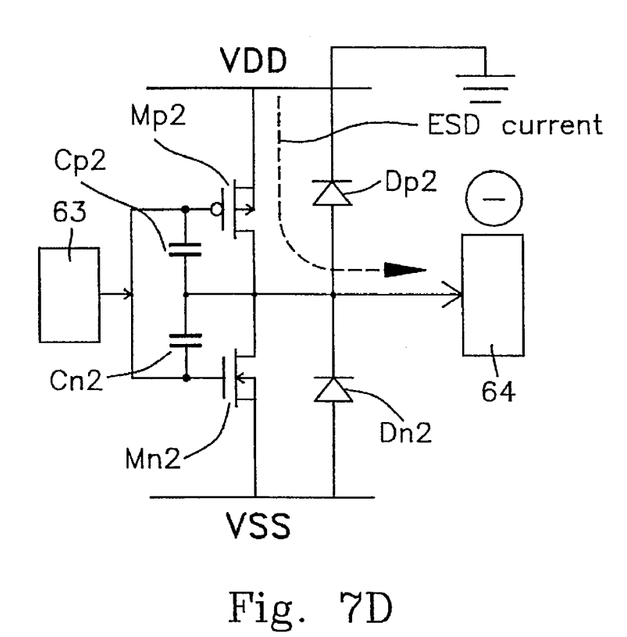

(4) ND mode:

As an ND-mode ESD stress occurs at the output pad 64, the negative ESD voltage rises very quickly. The quick rising ESD voltage is coupled with a portion of negative voltage to the gate of the PMOS Mp2 by the capacitor Cp2. The coupled negative gate voltage rams on the PMOS Mp2 to bypass ESD current. The coupled voltage to the gate of the PMOS Mp2 can be adjusted and designed by setting suitable capacitance of the capacitor Cp2. The PMOS Mp2 is often designed with larger W/L ratio and it is usually implemented in the multiple finger-type layout as that for the aforementioned layout example. The coupled gate voltage facilitates the multiple fingers of the large-dimension PMOS Mp2 to be turned on more uniformly in order to bypass ESD current, thereby significantly improving the ESD failure threshold of the PMOS Mp2. In this case, the ESD current flow is shown in FIG. 7D.

Figure 8:
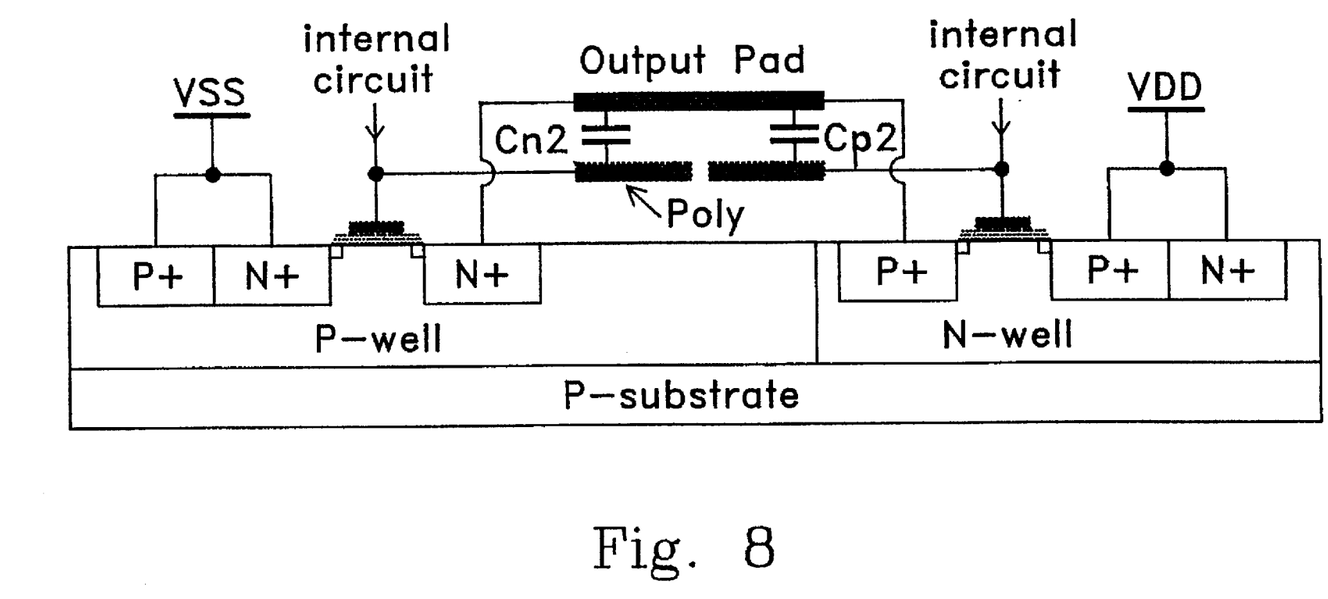
FIG. 8 is a cross-sectional view schematically showing the preferred embodiment of FIG. 6.

The corresponding schematic cross-sectional view of the preferred embodiment of FIG. 6 is shown in FIG. 8, where the p-substrate twin-well CMOS technology is used. Of course, the p-well, n-well or twin-well in n-type substrate can also be used. To achieve the capacitor-couple effect without increasing total layout area to the pad, the capacitors Cn2 and Cp2 are realized by inserting the poly layers right under the metal pad. The capacitances of the capacitors Cp2 and Cn2 can be adjusted by drawing different overlapped area of the poly layer right under the metal pad.

To sum up, the four modes of ESD stresses at the input pad are protected by the capacitor-coupled NMOS Mn1, the diode Dn1, the diode Dp1 and the capacitor-coupled PMOS Mp1, respectively. Thus, the internal circuit of the IC connected to the input pad can be fully protected from the damage caused by the ESD current. The coupled positive or negative voltage on the gate of NMOS Mn1 or PMOS Mp1 is sustained longer in time by the resistor Rn or Rp to effectively lower the snapback voltage of MOS Mn1 or Mp1. Thus the MOS Mn1 or Mp1 can be more uniformly turned on with much lower drain breakdown voltage under ESD transitions. The magnitude and holding time of ESD transient coupled voltage on the gate of MOS Mn1 or Mp1 can be adjusted by Cn1 and Rn or Cp1 and Rp to make the ESD protection circuit active only in ESD-stress events but inactive in normal operating conditions of the IC. On the other hand, by using the capacitor-couple technique in the output pad region according to the present invention, the output buffer of the IC can be protected from the damage caused by the ESD current even without being treated with ESD-implantation process.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A capacitor-couple electrostatic discharge (ESD) protection circuit adapted to be used in an integrated circuit (IC) and connected between an input pad and an internal circuit of said IC for protecting said internal circuit from being damaged by an ESD current, said capacitor-couple ESD protection circuit comprising:

an ESD bypass device electrically connected to said internal circuit for protecting said internal circuit by bypassing said ESD current, said device comprising an NMOS transistor having a gate for bypassing said ESD current when an ESD voltage of said ESD current occurring at said input pad is in a first polarity state and a PMOS transistor having a gate for bypassing said ESD current when said ESD voltage occurring at said input pad is in a second polarity state;

a capacitor-couple circuit electrically connected to said ESD bypass device and coupling a portion of said ESD voltage to said gate of said NMOS transistor when said ESD voltage occurring at said input pad is said first polarity, and to said gate of said PMOS transistor when said ESD voltage occurring at said input pad is in said second polarity state; and a potential leveling device comprising a first diode and a second diode parasitized to said ESD bypass device for keeping said ESD voltage transmitted for said internal circuit at a low potential level and bypassing said ESD voltage via said first diode when said ESD voltage occurring at said input pad is in a third polarity state and via said second diode when said ESD voltage occurring at said input pad is in a fourth polarity state.

2. A capacitor-couple ESD protection circuit according to claim 1 wherein said capacitor-couple circuit includes a capacitor.

3. A capacitor-couple ESD protection circuit according to claim 1 wherein said gate, source and drain electrodes of each of said NMOS transistor and said PMOS transistor are electrically connected to said capacitor-couple circuit, said input pad, and a power source terminal, respectively.

4. A capacitor-couple ESD protection circuit according to claim 1 wherein said NMOS transistor and said PMOS transistor are enhancement MOS transistors.

5. A capacitor-couple ESD protection circuit according to claim 1 further comprising a delay circuit electrically connected to said input pad and said ESD bypass device for delaying the conductive time of said ESD bypass device when said ESD current occurs at said input pad, and turning said ESD bypass device off when said IC is in normal operating conditions.

6. A capacitor-couple ESD protection circuit according to claim 5 wherein said delay circuit includes a resistor.

7. A capacitor-couple ESD protection circuit according to claim 1 wherein said ESD voltage in said first polarity occurs responsive to said ESD voltage being a positive polarity relative to VSS and with a floating VDD, in said second polarity occurs responsive to said ESD voltage being a negative polarity relative to VDD and with a floating VSS, in said third polarity occurs responsive to said ESD voltage being a negative polarity relative to VSS and with a floating VDD, and in said fourth polarity occurs responsive to said ESD voltage being a positive polarity relative to VDD and with a floating VSS.

8. A capacitor-couple electrostatic discharge (ESD) protection circuit adapted to be used in an integrated circuit (IC) and connected between an internal circuit and an output pad of said IC for protecting an output buffer, said capacitor-couple ESD protection circuit comprising:

an ESD bypass device electrically connected to said output pad for bypassing said ESD current inputted from said output pad, said device comprising an NMOS transistor having a gate for bypassing said ESD current when said ESD voltage occurring at said input pad is in a first polarity state and a PMOS transistor or having a gate for bypassing said ESD current when said ESD voltage occurring at said input pad is in a second polarity state;

an ESD bypass device electrically connected to said internal circuit for protecting said internal circuit by bypassing said ESD current;

a capacitor-couple circuit electrically connected to said ESD bypass device and coupling a portion of ESD voltage to said gate of said NMOS transistor when said ESD voltage occurring at said output pad is in a first polarity state, and said gate of said PMOS transistor when said ESD voltage occurring at said input pad is in said second polarity state; and a potential leveling device comprising a first diode and a second diode parasitizing to said ESD bypass device for keeping said ESD voltage transmitted for said internal circuit at a low potential level and bypassing said ESD voltage via said first diode when said ESD voltage occurring at said output pad is in a third polarity state and via second diode when said ESD voltage occurring at said input pad is in a fourth polarity state.

9. A capacitor-couple ESD protection circuit according to claim 8 wherein said capacitor-couple circuit includes a capacitor.

10. A capacitor-couple ESD protection circuit according to claim 8 wherein the gate, source and drain electrodes of each of said NMOS transistor transistor and said PMOS transistor transistors are electrically connected to said capacitor-couple circuit, said output pad, and a power source terminal, respectively.

11. A capacitor-couple ESD protection circuit according to claim 8 wherein said ESD voltage in said first polarity occurs responsive to said ESD voltage being a positive polarity relative to VSS and with a floating VDD, in said second polarity occurs responsive to said ESD voltage being a negative polarity relative to VDD and with a floating VSS, in said third polarity occurs responsive to said ESD voltage being a negative polarity relative to VSS and with a floating VDD, and in said fourth polarity occurs responsive to said ESD voltage being a positive polarity relative to VDD and with a floating VSS.

* * * * *